United States Patent [19]

Gündner et al.

[11] Patent Number: 4,626,675
[45] Date of Patent: Dec. 2, 1986

[54] DEMULTIPLEXING PHOTODIODE SENSITIVE TO PLURAL WAVELENGTH BANDS

[75] Inventors: Hans M. Gündner, Benningen; Kurt Hess, Stuttgart, both of Fed. Rep. of Germany

[73] Assignee: International Standard Electric Corporation, New York, N.Y.

[21] Appl. No.: 467,122

[22] Filed: Feb. 16, 1983

[30] Foreign Application Priority Data

Feb. 22, 1982 [DE] Fed. Rep. of Germany ....... 3206312

[51] Int. Cl.$^4$ ............................................. H01J 40/14
[52] U.S. Cl. ................................... 250/211 J; 357/30
[58] Field of Search ............ 250/211 R, 211 J, 370 R, 250/338; 357/30, 16; 350/1.1

[56] References Cited

U.S. PATENT DOCUMENTS

| | | | |
|---|---|---|---|
| 3,962,578 | 6/1976 | Rochen | 250/211 R |
| 4,258,375 | 3/1981 | Hsieh et al. | 357/16 |
| 4,297,720 | 10/1981 | Nishizawa et al. | 357/30 |
| 4,300,811 | 11/1981 | Ettenberg et al. | 350/1.1 |
| 4,301,463 | 11/1981 | Barrus, Jr. et al. | 357/30 |
| 4,323,911 | 4/1982 | Campbell et al. | 357/30 |
| 4,382,265 | 5/1983 | Pearsall | 357/16 |
| 4,450,463 | 5/1984 | Chin | 357/30 |

FOREIGN PATENT DOCUMENTS 0142527  9/1982  Japan.

OTHER PUBLICATIONS

IBM Technical Disclosure—vol. 12, #9, Feb. 1970, p. 1486—Woodall & Shang.

Primary Examiner—David C. Nelms
Assistant Examiner—James G. Gatto
Attorney, Agent, or Firm—Donald J. Lenkszus

[57] ABSTRACT

A light-sensitive device is disclosed for separately detecting light of two different wavelength bands. Such a device can be used in optical data communication. The separate detection is accomplished by two separate pn junctions which are disposed on two different sides of a substrate and are optically in series. The pn junction lying in front in the light path responds to light of, e.g., 850 nm, but not to light in the range from 950 nm to 1,650 nm. The substrate acts as a filter and passes the light of longer wavelength while blocking the 850-nm light, so that the second pn junction is only reached by light in the range from 950 nm to 1,650 nm.

9 Claims, 1 Drawing Figure

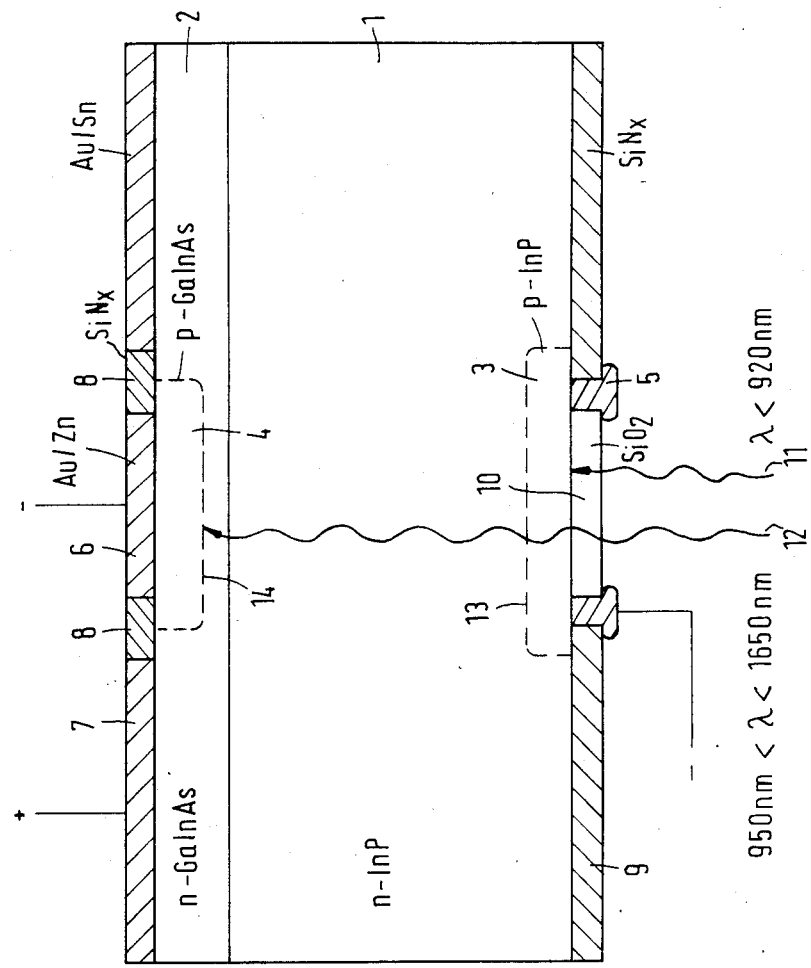

4,626,675

DEMULTIPLEXING PHOTODIODE SENSITIVE TO PLURAL WAVELENGTH BANDS

BACKGROUND OF THE INVENTION

1. Field of the Invention

The present invention relates to a light-sensitive device for separately detecting light of two different wavelength bands.

2. Description of the Prior Art

In optical data communication systems, there are times when two independent data streams are to be transmitted over one data channel (e.g., optical fiber) in different wavelength bands and then are to be processed separately.

In such systems, the two data streams are commonly separated by means of optical devices, such as prisms, color filters or interference filters. A wavelength-demultiplexing light-sensitive device is described on pages 388 and 389 of the June 21, 1979 issue of the journal "Electronics Letters". There, a number of layers are deposited on a substrate using mesa technology to form two pn junctions which are optically in series, and a filter interposed between these pn junctions. The first pn junction responds only to photons of higher energy, i.e., to light of shorter wavelength, than the second. The intermediate filter is a semiconductor layer whose absorption edge lies between the two wavelengths to be detected separately. An arrangement of this kind can detect light at different wavelengths without additional means, but it is difficult to build and not sufficiently selective.

SUMMARY OF THE INVENTION

The object of the invention is to provide a structure which is easier to manufacture and ensures higher selectivity.

A photon falling on a pn junction forms an electron-hole pair if the energy of the photon exceeds a certain minimum, which is the case up to an upper cutoff wavelength. In the case of light of longer wavelength, the energy of the photons is too low for this. Accordingly, a pn junction is transparent to longer wavelengths. Due to the thinness of the pn junction, however, a few photons of sufficient energy also reach the region lying behind the pn junction. If they reach the second pn junction, they will generate electron-hole pairs there and, thus, cannot be distinguished from photons of less energy, i.e., from light of longer wavelength. The proportion of those photons of higher energy reaching the second pn junction depends on the thickness of the intermediate layer acting as a filter. A layer of maximum thickness and with optimum filtering action is obtained if the two pn junctions are disposed on opposite sides of a substrate which is transparent to one of the two wavelength bands, and opaque to the other.

DESCRIPTION OF THE DRAWING

The drawing is a cross-sectional view of a light-sensitive device constructed in accordance with the invention.

DESCRIPTION OF THE INVENTION

An embodiment of the invention will now be explained in more detail with reference to the accompanying drawing. The plane of section is normal to the light entrance aperture. The device may exhibit rotational symmetry.

The support of the light-sensitive device is a substrate 1 of n-type InP material. An n-type $Ga_xIn_{1-x}As_yP_{1-y}$ with selected values of x and y layer 2 is deposited on one side of the substrate. In this layer 2 and on the other side of the substrate, a p-type $Ga_xIn_{1-x}As_yP_{1-y}$ with selected values of x and y region 4 and a p-type InP region 3, respectively, are formed by diffusion of acceptors (e.g., Cd for InP). Contact is made to the p-type region 3 at the front by a contact 5 made of an Au-Zn alloy, and the p-type region 4 at the back carries an area contact 6, also made of an Au-Zn alloy. Contact to the two contiguous n-type layers is made at the back by a coating 7 of an Au-Sn alloy. An insulating ring 8 of $SiN_x$ covers the interface between the p-type region 4 and the n-type layer 2 from external influences and insulates the area contact 6 from the contact-making coating 7. Similar protection is provided by a cover 9, also of $SiN_x$. A window 10 of $SiO_2$ or $SiN_x$ is designed to reduce reflection losses and protect the region 3. The whole arrangement may be encapsulated in the known manner (not shown).

A light beam 11 with a wavelength of about 850 nm enters through the window 10 and generates electron-hole pairs in the pn junction 13 produced between the substrate 1 and the region 3. The resulting voltage can be picked off between the ring-shaped contact 5 and the contact-making coating 7.

The light beam 11 is not completely absorbed in the space-charge region formed by the pn junction 13. A small portion penetrates further into the substrate 1 but is highly attenuated there, so that only a very small portion of the light beam 11 will reach the pn junction 14 formed between the layer 2 and the region 4. A second light beam 12, which geometrically coincides with the light beam 11, has a wavelength of about 950 nm–1,650 nm. To this beam, InP is transparent; the first pn junction 13 does not respond to light of this wavelength. The light beam 12 thus reaches the second pn junction 14 virtually unattenuated and generates electron-hole pairs there. The voltage thus produced can be picked off between the area contact 6 and the contact-making coating 7.

What is claimed is:

1. Light-sensitive device for separately detecting light of two different wavelength bands, comprising:
   a substrate that is transparent to one of the two wavelength bands, and opaque to the other; and
   two pn junctions located on opposite sides of the substrate and optically in series having different cutoff wavelengths for the photovoltaic effect, said substrate forming at least a portion of one of said pn junctions.

2. A light-sensitive device as claimed in claim 1, comprising the following layers following each other in the path of the incident light:
   a p-type layer of a first semiconductor material;
   an n-type layer of this first semiconductor material;
   an n-type layer of a second semiconductor material; and
   a p-type layer of the second semiconductor material.

3. A light-sensitive device as claimed in claim 2, wherein one of the two n-type layers is the substrate for the device.

4. A light-sensitive device as claimed in claim 2, wherein the first and second semiconductor materials are InP and $Ga_xIn_{1-x}As_yP_{1-y}$, respectively, with x and y having selected values such that light with a wavelength shorter than 920 nm, preferably about 850 nm, is used in one of the wavelength bands, while wavelengths between 950 nm and 1,650 nm are used in the other wavelength band.

5. A light-sensitive device as claimed in claim 3, wherein the first and second semiconductor materials are InP and $Ga_xIn_{1-x}As_yP_{1-y}$, respectively, with x and y having selected values such that light with a wavelength shorter than 920 nm, preferably about 850 nm, is used in one of the wavelength bands, while wavelengths between 950 nm and 1,650 nm are used in the other wavelength band.

6. A light-sensitive device as claimed in claim 2, wherein the two p-type layers are regions with acceptors diffused into the respective semiconductor material.

7. A light-sensitive device as claimed in claim 3, wherein the two p-type layers are regions with acceptors diffused into the respective semiconductor material.

8. A light-sensitive device as claimed in claim 4, wherein the two p-type layes are regions with acceptors diffused into the respective semiconductor material.

9. A light-sensitive device as claimed in claim 5, wherein the two p-type layers are regions with acceptors diffused into the respective semiconductor material.

* * * * *